(12) United States Patent
Sato (10) Patent No.: US 9,188,701 B2
(45) Date of Patent: Nov. 17, 2015

(54) POWER GENERATION PREDICTING APPARATUS AND METHOD THEREOF

(75) Inventor: Makoto Sato, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 715 days.

(21) Appl. No.: 13/536,042

(22) Filed: Jun. 28, 2012

(65) Prior Publication Data

US 2013/0066569 A1 Mar. 14, 2013

(30) Foreign Application Priority Data

Sep. 13, 2011 (JP) .................................. 2011-199866

(51) Int. Cl.
| | | |
|---|---|---|
| *H01L 31/00* | (2006.01) | |
| *G01W 1/10* | (2006.01) | |
| *G06Q 50/06* | (2012.01) | |
| *H01L 31/02* | (2006.01) | |

(52) U.S. Cl.
CPC .................. *G01W 1/10* (2013.01); *G06Q 50/06* (2013.01); *H01L 31/02021* (2013.01); *Y02E 10/50* (2013.01)

(58) Field of Classification Search
CPC ............. H01L 31/02021; G06Q 50/06; Y02E 10/50–10/52
See application file for complete search history.

(56) References Cited

FOREIGN PATENT DOCUMENTS

JP 2010-186840 8/2010

*Primary Examiner* — Mischita Henson
(74) *Attorney, Agent, or Firm* — Oblon, McClelland, Maier & Neustadt, L.L.P.

(57) ABSTRACT

A power generation predicting apparatus includes an estimator estimates a maximum power generation amount capable of generating by a photovoltaic power generation system at each time, a first estimating unit estimates a power generation inhibitor total amount being a total of power generation inhibiting substances which are present until a solar light reaches the system, at each time, a weight calculating unit calculates a solar radiation weight for each of three-dimensional cells at each time, based on a straight line passing through the cells forming a three-dimensional space above a prediction target area at which the system is placed, a second estimating unit estimates a power generation inhibitor amount at a prediction target time for each of the cells, and a predicting unit calculates a power generation inhibitor total amount at the prediction target time, and predicts a power generation amount at the prediction target time.

8 Claims, 12 Drawing Sheets

EXAMPLE OF PV FACILITY DATA

| SITE ID | LATITUDE | LONGITUDE | POWER GENERATION ABILITY | PANEL ELEVATION ANGLE | PANEL AZIMUTH ANGLE |
|---|---|---|---|---|---|
| S001 | 36.5478 | 136.2352 | 300kW/h | 10° | 180° |
| S002 | 36.2545 | 136.1082 | 100kW/h | 10° | 180° |
| S003 | 36.4827 | 136.3552 | 39kW/h | 20° | 170° |

POWER GENERATION PREDICTING APPARATUS AND METHOD THEREOF

CROSS REFERENCE TO RELATED APPLICATIONS

This application is based upon and claims the benefit of priority from the prior Japanese Patent Application No. 2011-199866, filed on Sep. 13, 2011, the entire contents of which are incorporated herein by reference.

FIELD

Embodiments described herein relate to a power generation predicting apparatus and a method thereof, and relate to, for example, a short-term power generation amount predicting apparatus of a photovoltaic power generation system capable of performing prediction of several hours ahead with high precision by collecting power generation data of a plurality of sites by a center and combining the power generation data with the latest meteorological information.

BACKGROUND

The power generation amount of a photovoltaic power generation system is susceptible to solar radiation and is unstable, and therefore, attention is paid to an apparatus that predicts a short-term power generation amount. Concerning the short-term power generation prediction of a photovoltaic power generation system, the following method is known. The method is for predicting a power generation amount by performing short-term prediction of a solar radiation value of a prediction target time by using a regression model from meteorological forecast data in a range of the prediction target time from a certain time, and solar radiation value time series up to the time. As the regression model, a linear model, a neural net and the like can be used. Further, the method of Japanese Patent Application No. 2009-29211 estimates a situation of clouds from a power generation situation at a certain time, and performs short-term power generation amount prediction by using spatial information. However, as the cloud situation, processing as three-dimensional spatial information is not described.

According to the technique using the regression model described above, it can be expected that prediction with accuracy to some degree is enabled by combining a meteorological prediction result which is estimated from various meteorological data and actual power generation data. However, the meteorological conditions vary depending on the installation situations of photovoltaic power generation systems, seasons and time zones, and construction of a regression model which is compatible with any situation is difficult. Therefore, there arises the problem that the prediction accuracy is limited. Further, according to the technique of Japanese Patent Application No. 2009-29211 described above, it can be expected that prediction of a power generation amount by using spatial information such as clouds is enabled. However, in the movements of clouds, movements in a vertical direction and a horizontal direction of a cirrus cloud, a cumulus cloud and the like have to be considered. Therefore, there arises the problem that accurate estimation of a cloud situation and power generation amount prediction are difficult unless three-dimensional spatial information cannot be dealt with.

DETAILED DESCRIPTION

According to an embodiment, there is provided a power generation predicting apparatus, including: a first storage, a second storage, a power generation amount estimator, a first estimating unit, a weight calculating unit, a third storage, a second estimating unit and a predicting unit.

The first storage stores PV power generation data including actual results of a power generation amount by a photovoltaic power generation system in time series.

The second storage stores PV facility data representing an installation position and a power generation ability of the photovoltaic power generation system.

The power generation amount estimator estimates a maximum power generation amount capable of generating by the photovoltaic power generation system at each time based on the PV power generation data.

The first estimating unit estimates a power generation inhibitor total amount at each time based on the maximum power generation amount wherein the power generation inhibitor total amount is a total of power generation inhibiting substances which are present until a solar light reaches the photovoltaic power generation system.

The weight calculating unit calculates a solar radiation weight for each of three-dimensional cells at each time based on a straight line passing through the three-dimensional cells wherein the three-dimensional cells form a three-dimensional space above a prediction target area at which the photovoltaic power generation system is placed, the straight line is a line connecting between a solar position and the photovoltaic power generation system, and the solar radiation weight expresses an influence degree of each of three-dimensional cells with respect to the power generation inhibitor total amount.

The third storage stores meteorological situation data of the three-dimensional cells.

The second estimating unit estimates a power generation inhibitor amount in each of the three-dimensional cells at a prediction target time based on the power generation inhibitor total amount, the solar radiation weight, and the meteorological situation data.

The predicting unit calculates a power generation inhibitor total amount at the prediction target time based on the power generation inhibitor amount and the solar radiation weight of each of the three-dimensional cells at the prediction target time, and predicts a power generation amount at the prediction target time based on the power generation inhibitor total amount at the prediction target time, and the maximum power generation amount corresponding to the prediction target time.

Hereinafter, an embodiment will be described based on the drawings.

A power generation amount of a photovoltaic power generation system is significantly susceptible to meteorological conditions. Semiconductors configuring photovoltaic power generation panels have power generation abilities determined by a temperature and a solar radiation value. When the temperature of the panels becomes high, and when the solar radiation value becomes small, the power generation amount is significantly reduced. The temperature of the panels is susceptible to an atmospheric temperature and a solar radiation amount and changes, and the solar radiation amount is susceptible to the azimuth of the sun, clouds, the amount of suspended solids such as aerosol and changes. In order to keep a stable power system, it is important to know power of what degree the photovoltaic power generation system in a certain area can generate hence forward.

Figure 3:
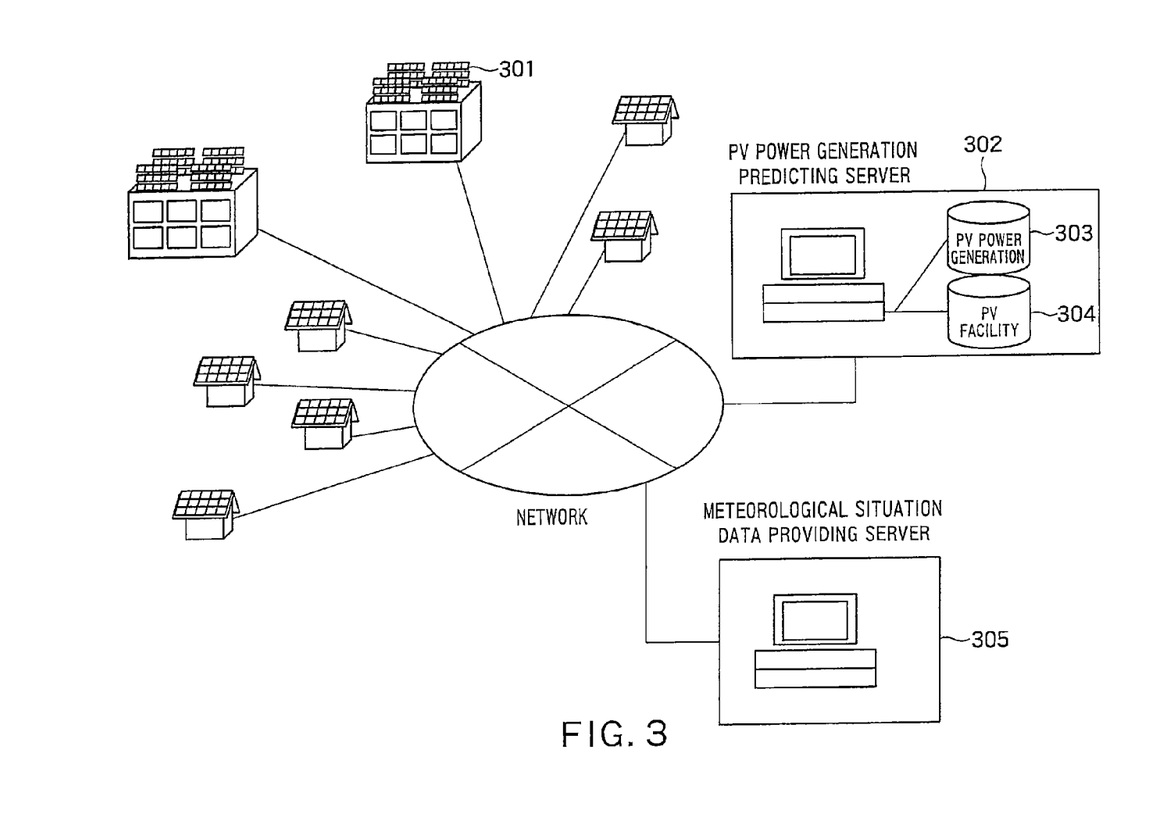
FIG. 3 is a general view of a system according to the embodiment.

FIG. 3 is a general view of a system according to the embodiment. In FIG. 3, a plurality of photovoltaic power generation (PV) systems 301 exist dispersedly, and are connected to a network. A PV power generation predicting server 302 which is present via the network can collect power generation amount data of these PV systems. The collected data are accumulated in a PV power generation DB 303. Further, the PV power generation predicting server 302 stores facility information such as an installation position and a power generation ability with respect to each of the PV systems. The PV facility information is accumulated in a PV facility DB 304. In recent years, data and prediction data relating to various meteorological situations have been available via networks. The PV power generation predicting server 302 can acquire the latest information of the data like this from a meteorological situation data providing server 305.

However, the meteorological situation data which are acquired include the data from which real-time information cannot be obtained, such as the data updated only twice a day. Meanwhile, as the power generation amount prediction, accurate prediction needs to performed with respect to a time range to the future several hours to about one day ahead from the present point of time. It is important to perform power generation amount prediction by accurately estimating an actual meteorological situation and thereafter, combining the estimation with the PV power generation data. In particular, the present embodiment has the feature of performing estimation of a meteorological situation in a three-dimensional space by using the PV power generation data in consideration of the characteristics of the photovoltaic power generation system which is susceptible to the azimuth of the sun and the like.

Figure 1:
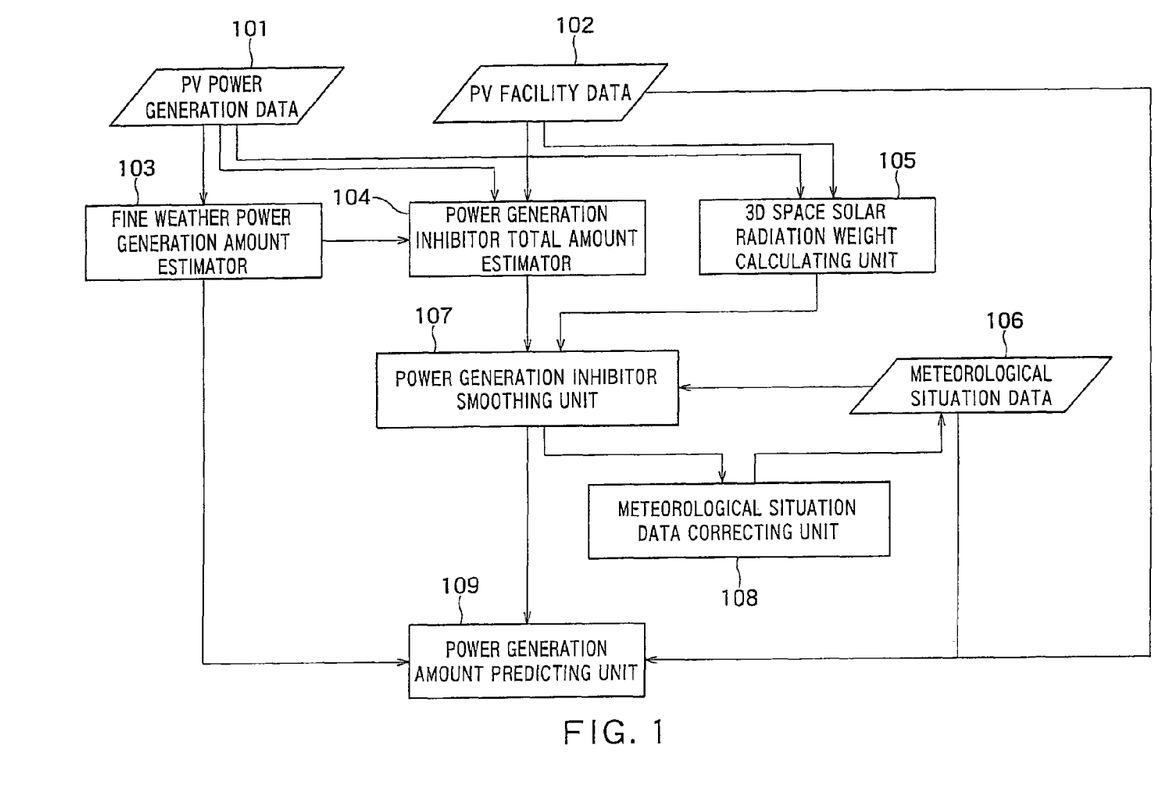
FIG. 1 is a configuration diagram of a short-term power generation predicting apparatus of a photovoltaic power generation system according to an embodiment.

FIG. 1 is a configuration diagram showing one embodiment of a short-term power generation predicting apparatus of the photovoltaic power generation system according to the present embodiment.

As shown in FIG. 1, the short-term power generation predicting apparatus of the photovoltaic power generation system includes a PV power generation data storage 101, a PV facility data storage 102, a fine weather power generation amount estimator 103, a power generation inhibitor total amount estimator (or a first estimating unit) 104, a 3D space solar radiation weight calculating unit 105, a meteorological situation data storage 106, a power generation inhibitor amount smoothing unit (or a second estimating unit) 107, a meteorological situation data correcting unit 108, and a power generation amount predicting unit 109. The short-term power generation predicting apparatus can be provided in the PV power generation predicting server 302 of FIG. 3. Each function of the apparatus of FIG. 1 can be realized as a program module which is executed by a computer including a processor such as a CPU. The program module may be stored in a computer readable recording media such as a hard disk, a memory device, and a CD-ROM.

The PV power generation data storage 101 stores the power generation actual result data which are collected from a plurality of PV systems in a target area.

The power generation actual result data include time-series data of a) a combination of {time, voltage, current} and b) a combination of {time, power}. By multiplying the current and the voltage of a), the same result as the power of b) can be obtained. These time-series data need to be accumulated in the situation in which the time-series data is discriminable with respect to each of the PV systems.

Further, for example, even though the PV systems are in the same site, if the PV systems differ from each other significantly in the angles at which they are installed, data is individually needed with respect to each of the PV systems. When short-term prediction for the future is performed from a certain time on a certain day, not only the power generation actual result data to the time on that day, but also the power generation actual result data from several days to about one month ago need to be obtained.

As for a sampling interval of the data, the data of the date of prediction (or the data of current day) need to be obtained at somewhat short time intervals like every one minute, every ten minutes or the like, but the data of the previous days may be obtained, for example, every 30 minutes or the like.

Hereinafter, the description will be made on the assumption that data concerning times and electric power are obtained as the power generation actual result data.

Figure 4:
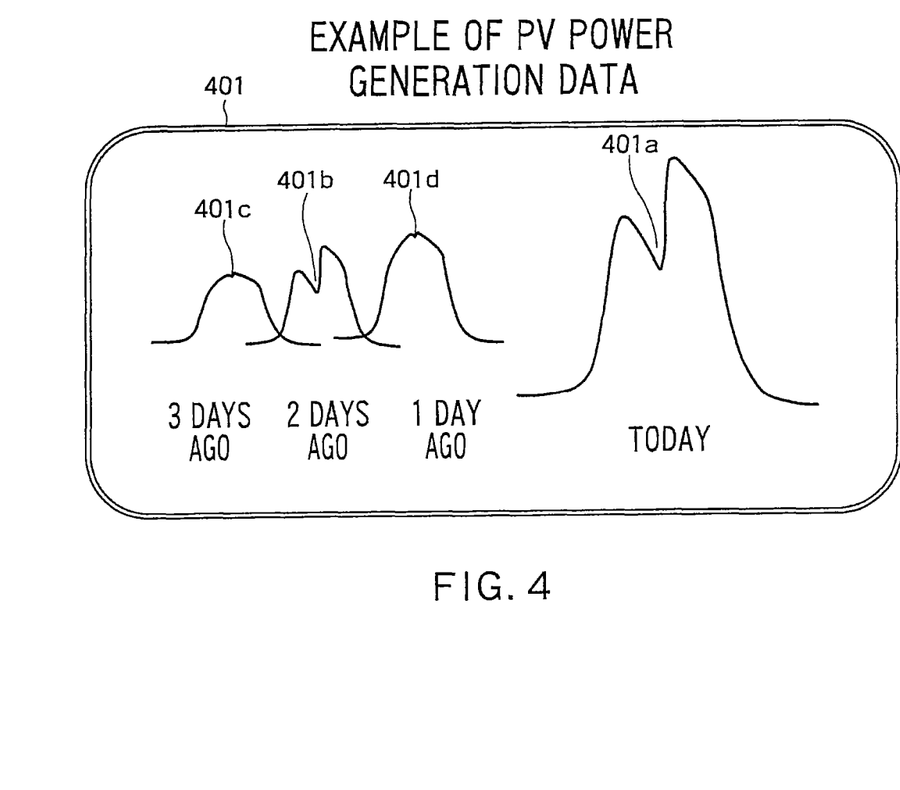
FIG. 4 is a diagram showing an example of PV power generation data.

FIG. 4 shows an example of the PV power generation data of a PV system which is present in a certain site.

In FIG. 4, the power data from three days ago are plotted with the X-axis as the time. The data of the present day is displayed to be large by being emphasized at a front of the page space.

The power generation amount of the PV system increases with the rising sun, and decreases as the sun sets. In the nighttime, the power generation amount is zero. In many cases, under fine weather conditions, the power generation amounts are in parabolas. However, with occurrence of clouds, shapes 401a, 401b, 401c and 401d of chipped parabolas appear, and the power generation amount becomes unstable.

Further, due to revolution of the earth, the visual movement of the sun slightly changes day by day, and significantly influences the power generation amount. However, the change of the solar orbit due to revolution or the like is relatively easy to handle from the viewpoint of prediction of the power generation amount. Solar radiation inhibitors which exist between the sun and the site where the PV system is installed, such as clouds and aerosol such as yellow sand make prediction of the power generation amount more difficult than the change of the solar orbit.

Thus, in the present embodiment, prediction of the power generation amount at the time of fine weather and the presence of solar radiation inhibitors will be separately dealt with.

The PV facility data storage 102 stores facility information relating to meteorology, of the photovoltaic power generation systems, such as the installation positions and the power generation abilities of a plurality of photovoltaic power generation systems, as PV facility data.

Figure 5:
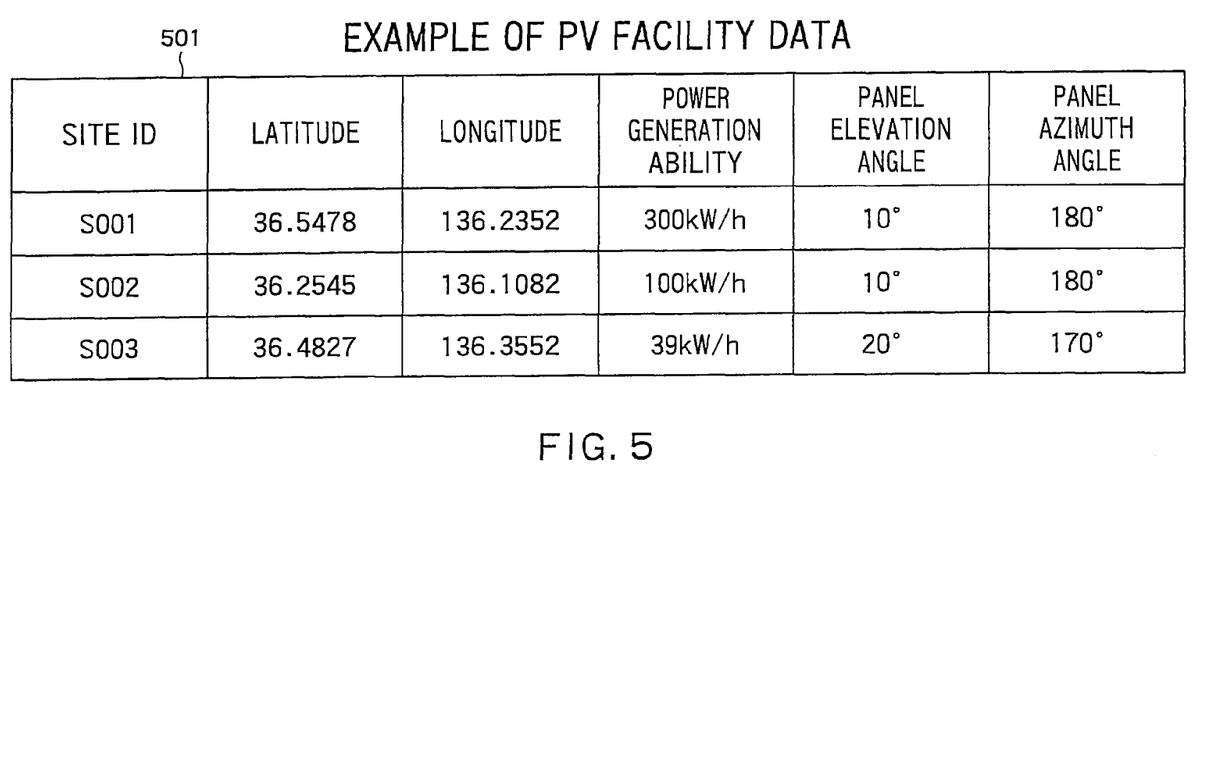
FIG. 5 is a diagram showing an example of PV facility data.

FIG. 5 shows an example of the PV facility data.

Site IDs, latitudes, longitudes, power generation abilities, panel elevation angles, and panel azimuth angles are accumulated.

As the power generation abilities, the rated current values and voltage values may be adopted. Further, the panel azimuth angle of 180° means due south.

Even though PV systems are in the same site, if the PV systems have different panel azimuth angles or the like, the PV systems need to be managed with different IDs. Further, even if PV systems have the same azimuth angles, if they are in a large-scale system, they may be managed with different IDs at each sub-system. However, the site ID and the ID of the PV power generation data need to correspond to each other.

The fine weather power generation amount estimator 103 estimates the power generation amount (maximum power-generation amount) which can be generated by the photovoltaic power generation system when it is assumed to be fine weather in the time zone before and after the prediction target time on a prediction target date, as a fine weather power generation amount, by using the PV power generation data stored in the PV power generation data 101.

The estimation needs to be performed for each site identified by the site ID, and the estimation result can be expressed by the curve of a time and a power generation amount.

Here, the fine weather time does not mean that a solar radiation inhibitor is not present at all, but means that the amount of the solar radiation inhibitor is relatively small enough to stabilize power generation to a certain degree.

Figure 6:
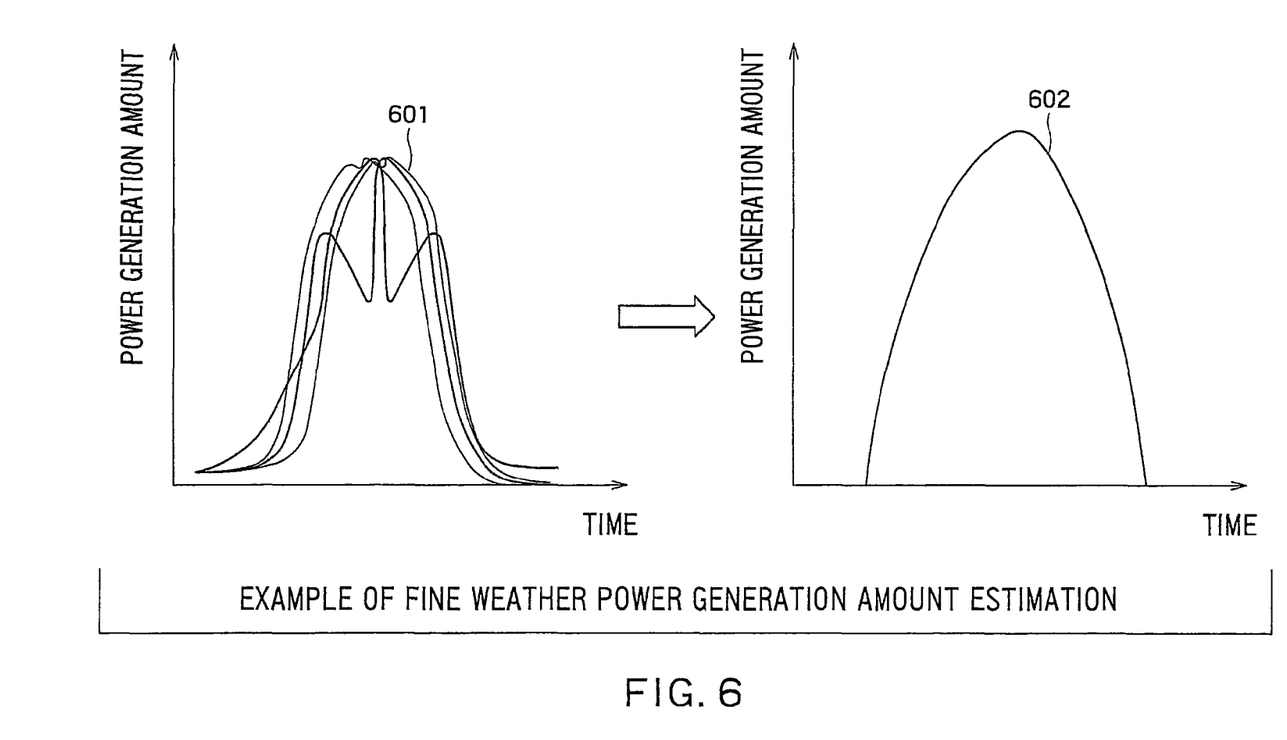
FIG. 6 is a diagram showing an example of fine weather power generation amount estimation.

FIG. 6 shows an example of fine weather time power generation estimation.

In FIG. 6, reference numeral 601 shows the power generation amount curves of several days by laying one on top of another, with respect to a certain PV system. At several times, the regions are present, in which power generations are considered to be lower than usual due to clouds or the like. Thus, for example, the fine weather power generation amount can be estimated by performing the following processing:

A1) performing moving average processing for respective power generation time-series data;
A2) selecting a maximum value of a plurality of power generation amount time series in each time; and
A3) performing moving average processing for the time series data obtained by processing A2).

Reference numeral 602 in FIG. 6 shows the result of applying the processing of A1) to A3) to the power generation amount data of several days of 601.

The power generation data includes a certain level of noise, and therefore, by calculating the maximum value by way of moving average processing or the like, the fine weather power generation amount can be estimated.

If the power generation amount in the case of fine weather can be estimated, it becomes possible to estimate to what degree the total amount of the substances which inhibit solar radiation such as clouds and aerosol is larger as compared with that at the time of fine weather by comparison with the actual power generation data.

The power generation inhibitor total amount estimator 104 estimates the total value of the power generation inhibiting substances which are present until the irradiated solar light reaches the photovoltaic power generation system, as a power generation inhibitor total amount, by using the PV power generation data, the PV facility data, and the estimate value of the fine weather power generation amount. Hereinafter, the power generation inhibitor total amount will be expressed by Y.

Figure 7:
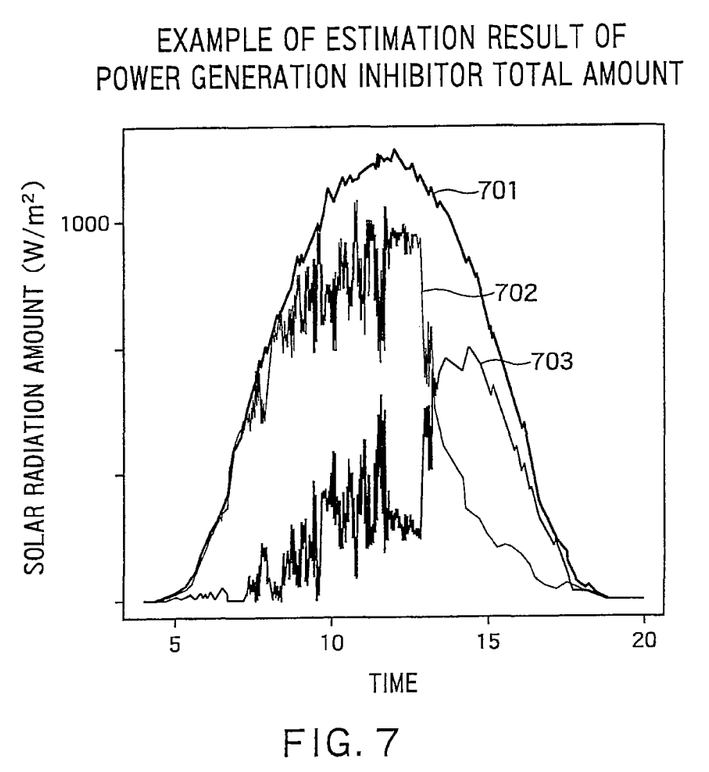
FIG. 7 is a diagram showing an example of power generation inhibitor total amount estimation.

FIG. 7 shows an example of power generation inhibitor total amount estimation. In the example of FIG. 7, the following processing is performed.

B1) The fine weather power generation amount 602 (see FIG. 6) is normalized with a power generation ability 501 (FIG. 5), and a maximum solar radiation amount curve 701 which is converted into a solar radiation amount is calculated. For example, when the power generation amount at a certain time is 330 kW/h in the system with the rating of 300 kW/h with 1000 W/m$^2$, calculation result is such that solar radiation of 330/300*1000=1100 W/m$^2$ can be expected at the time of fine weather.

B2) Similarly to processing B1), the actual power generation amount at the prediction target time is normalized with the power generation ability 501, and a solar radiation amount estimation value curve 702 which is converted into a solar radiation amount is calculated.

B3) The solar radiation amount estimation value curve 702 is subtracted from the maximum solar radiation amount curve 701, and thereby, a power generation inhibitor total amount "Y (s, t)" at each time is estimated. It should be noted that "s" represents a site, and "t" represents a time. Reference numeral 703 represents an estimated power generation inhibitor total amount curve.

The processing like this is performed in all the sites for the PV power generation data for the past several hours up to the present time, and thereby a power generation inhibitor total amount vector "{Y(t), $T_0 \le t \le T_1$}" is obtained. Here, $T_0$ is an estimation start time of the power generation inhibitor total amount, and $T_1$ is a present time. The vector length of Y(t) is equal to the number of sites.

For example, when the maximum solar radiation amount is 1100 W/m$^2$, and the actual power generation amount is equivalent to 900 W/m$^2$ at a certain time, a larger amount of solar radiation inhibitor is present in the atmosphere at the time than at the time of a case of fine weather by the amount corresponding to 1100−900=200 W/m$^2$. More specifically, this means that the solar radiation inhibitor is present on the straight line connecting the spot where the site is present to the sun. If it can be grasped at which position in concrete the solar radiation inhibitor is present, and if it can be predicted how the solar radiation inhibitor moves, the power generation amount can be accurately predicted.

The 3D space solar radiation weight calculating unit 105 calculates a 3D space solar radiation weight which expresses the influence degree of a three-dimensional cell with respect to solar radiation based on the overlap of the straight line connecting the position of the sun at each time and the facility position and the three-dimensional cell, for each of the three-dimensional cells which are obtained by uniformly dividing the three dimensional space of the prediction target area, by using the PV power generation data and the PV facility data.

Figure 8:
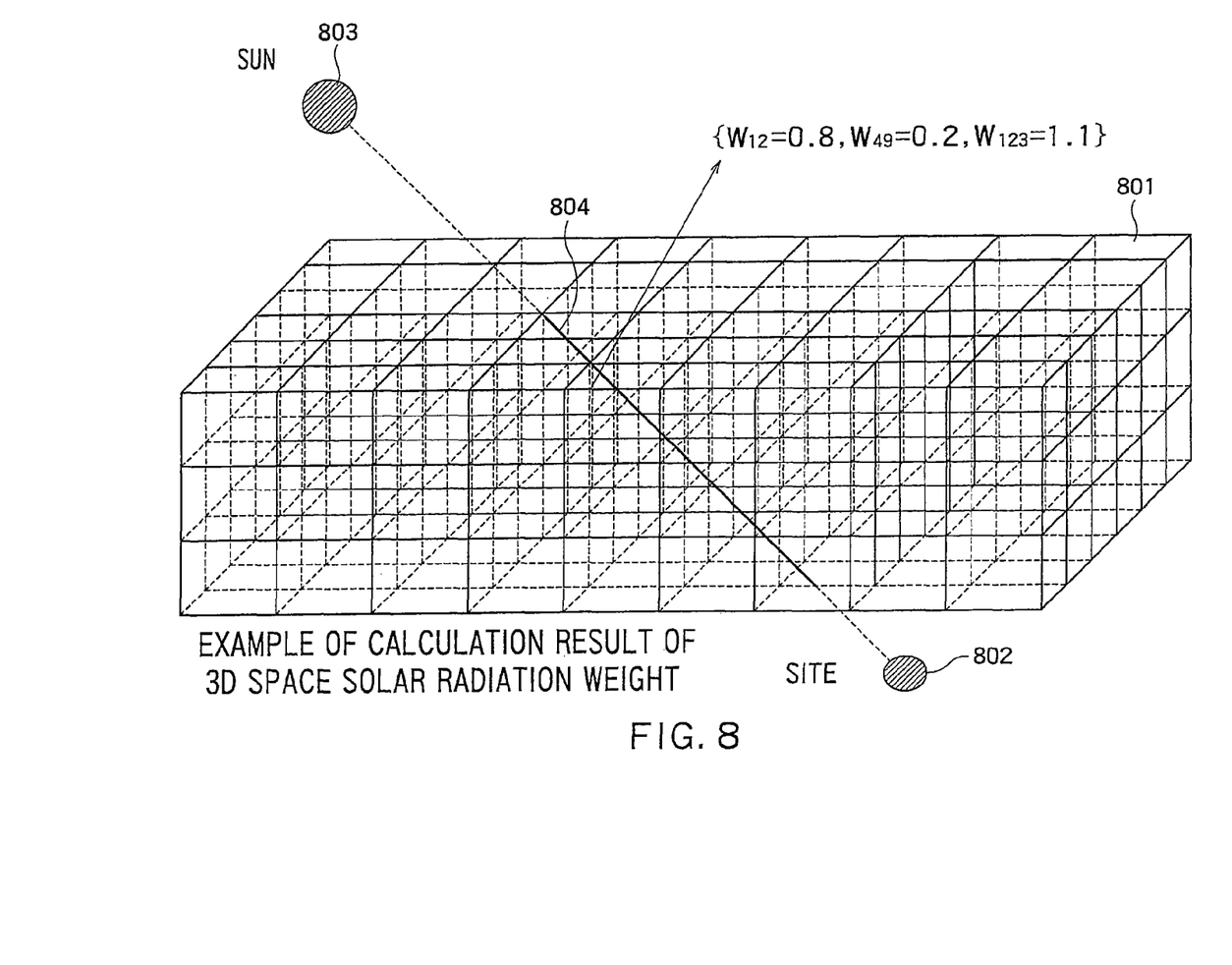
FIG. 8 is a view showing an example of 3D spatial solar radiation weight calculation.

FIG. 8 shows an example of the 3D space solar radiation weight calculation.

In FIG. 8, reference numeral 801 shows that regions which are obtained by dividing a space in the atmosphere above the ground into a three-dimensional mesh shape are set. These regions are called three-dimensional cells (sometimes simply called cells), and attribute values are assigned to the cells.

For example, when the variable expressing the amount of the power generation inhibitor is set as "X", the power generation inhibitor amount of the three-dimensional cell which is shown by the certain time "t" and a position (x, y, z) is expressed by X(t, x, y, z). Here, a capital "X" is a variable expressing a physical quantity, whereas a lower-case "x" is a variable expressing the x coordinate of the cell, and they express different things. Further, hereinafter, the power generation inhibitor amount is sometimes expressed as $X(t)=\{X_t(x, y, z)\}$.

When the power generation inhibitor substance of X(x, y, z) is included in a certain three-dimensional cell I(x, y, z), the amount showing to what extent the power generation of the site "s" is inhibited is a three-dimensional space solar radiation weight $W_t(s)=\{W_1(s)\}$. In FIG. 8, when the solar position on the celestial sphere in the time "t" is 803 to the site "s" located at 802, a positive weight is set to the three-dimensional cells in which the line segment connecting 802 and 803 passes in the regions, and the weight for the other cells is zero.

As for the calculation method of the weight, for example, the following calculation method is conceivable.

C1) 1 if the line segment passes in the regions, otherwise, 0
C2) Normalizing the length of the line segment passing in the region with the distance of diagonal vertexes of the three dimensional cell
C3) Normalizing the length of the line segment passing in the region with a height of the three-dimensional cell In the example of FIG. 8, the cells in which the line segment of a thick line 804 passes in the regions are only three cells with the cell ID=$\{12, 49, 123\}$, and the weights $W_t(s)=\{(W_t(12)=0.8, W_t(49)=0.2, W_t(123)=1.1\}$ are calculated by the processing C3.

Here, if the values of the power generation inhibitor amounts "X" of the cells are $\{X_t(12)=20, X_t(49)=50, X_t(123)=120\}$, the power generation inhibitor total amount $Y_t(s)$ is $$Y_t(s)=W_t(12)*X_t(12)+W_t(49)*X_t(49)+W_t(123)*X_t(123)=0.8*20+0.2*50+1.1*120=158\ [W/m^2] \quad \text{(equation 1)}$$

If the power generation inhibitor total amount is estimated to be 200 W/m$^2$ as in the example previously shown, it is found out that the estimation values of "X" of the three cells described above need to be a little larger.

The size and grading of the three-dimensional cell can be determined in accordance with the probability of occurrence of the power generation inhibitor. For example, clouds do not occur above the troposphere in the atmosphere, and therefore, the cells do not have to be set at the height higher than the troposphere. Further, concerning the place where atmosphere is not sufficiently present due to the influence of geographic features such as mountains and the like, the cells may be considered to be absent.

The data "Y" of the power generation inhibitor total amount which is obtained from the PV power generation data has extremely high real-time performance, and can be considered to be accurate data. However, in which position in a space the power generation inhibitor is distributed cannot be comprehensively measured, and only the information on the line segments connecting a plurality of sites and the sun is given. In order to estimate the value of the power generation inhibitor at the position other than this, it is useful to know how the meteorological situation is, and how the atmosphere is moving.

The meteorological situation data storage 106 has a variable "Z" corresponding to the meteorological situation data set on three-dimensional cells as the power generation amount inhibitor X, and stores data in each time "t" as meteorological situation data.

Figure 9:
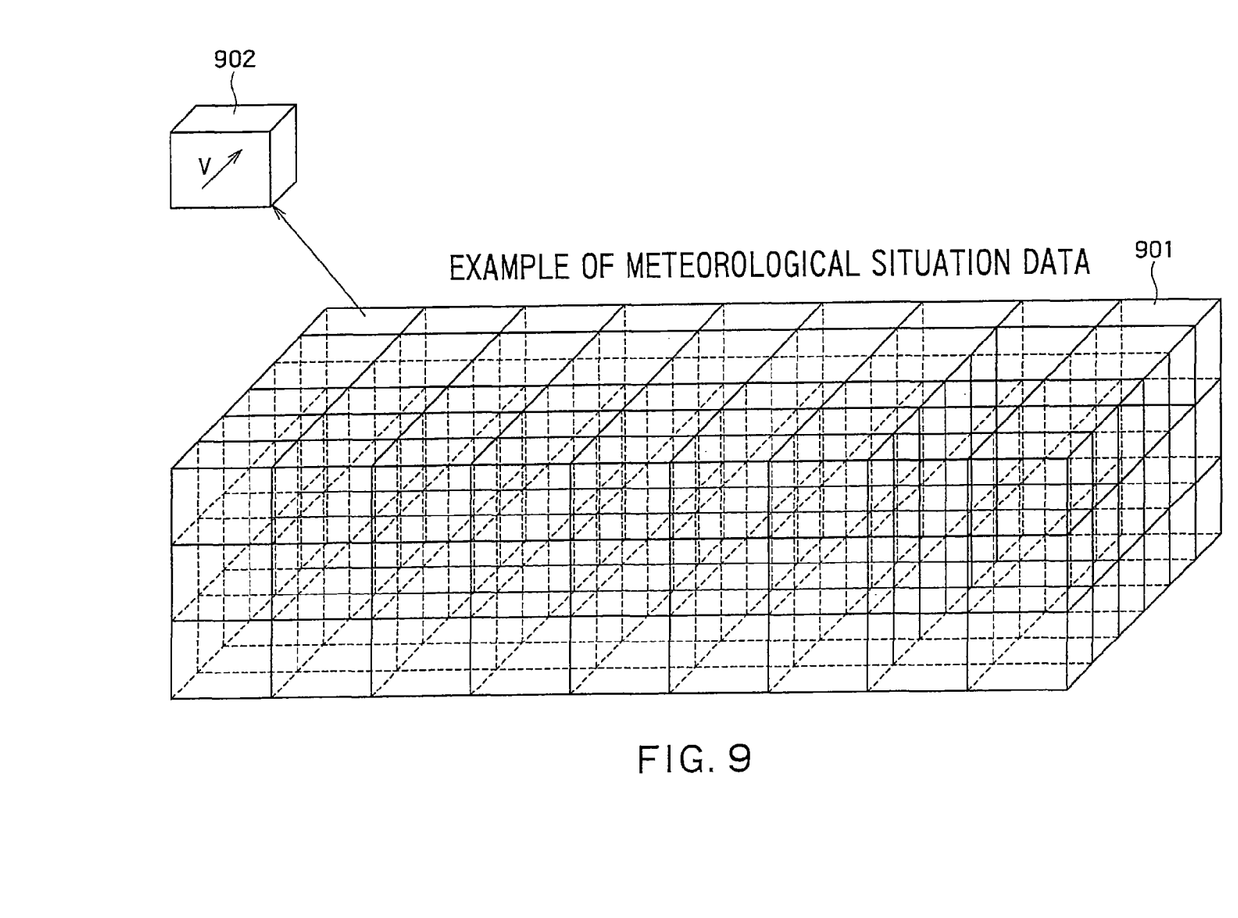
FIG. 9 is a view showing an example of meteorological situation data.

FIG. 9 is an example of the meteorological situation data, and three-dimensional vector data expressing a wind direction of the region is stored with respect to each of three-dimensional cells. More specifically, for each cell 902, $V=\{V_x, V_y, V_z\}$ is set. In addition to this, a potential temperature of the atmosphere in the cell can be added as the meteorological situation data.

An index of the three-dimensional cell for which the meteorological situation data "Z" is stored, and an index of the three-dimensional cell for which the power generation inhibitor X is stored desirably indicate the same region in the aspect of calculation efficiency, but conversion processing can be performed, and therefore, the indexes do not have to be necessarily the same.

As for wind velocity data "V", the data which is estimated based on the meteorological data observed by a meteorological observatory can be used, or the data obtained from the radar which observes a wind velocity such as a doppler radar may be used. Calculation software for estimating the wind velocity from atmospheric pressure and the like can be used from WRF and the like. (Document [1]: Michalakes, J., J. Dudhia, D. Gill, T. Henderson, J. Klemp, W. Skamarock, and W. Wang, 2004: "The Weather Research and Forecast Model: Software Architecture and Performance.", Proceedings of the 11$^{th}$ ECMWF Workshop on the Use of High Performance Computing In Meteorology, 25-29 Oct. 2004.).

The meteorological situation data provides information in a wide range which covers a power generation prediction target area, but is inferior to the PV power generation data in spatial resolution, temporal readiness and the like. Thus, combining the two pieces of information is important to grasp an accurate meteorological situation. At this time, it is essential to estimate how the spatial distribution of clouds, aerosol and the like is, and predict how the distribution will become henceforth.

The power generation inhibitor amount smoothing unit 107 calculates a state transition equation and an observation equation with the power generation inhibitor amount "X" on the three-dimensional cell as a state variable by using the power generation inhibitor total amount "Y", the 3D space solar radiation weight "W", and the meteorological situation data "Z", and estimates the power generation inhibitor amount at each time by state smoothing processing. Here, modeling can be made with respect to $T_0 \leq t \leq T_1$ from the estimation start time $T_0$ to the present time $T_1$ by the linear equations:

$$X_{t+1}=F(Z_t)*X_t+N(0, Q_t) \quad \text{D1)}$$

$$Y_t=H(W_t)*X_t+N(0,R_t). \quad \text{D2)}$$

Here, the equation D1 is the state transition equation when the state variable is set as "X", and is determined by adding up a state transition matrix F(Z) which is determined by the meteorological situation data "Z", and a normal distribution noise component which is determined by a covariance matrix $Q_t$. N(0, Qt) is normal distribution of an average of 0 and a covariance "Qt". Here, a vector length of "X" is the number of cells of the three-dimensional cells. For example, the amount of the power generation inhibitor which is advected and diffused from the times "t" to "t+1" in accordance with the wind direction can be given by F(Z)=F(V). To this end, the state transition matrix needs to be determined by using, an advection and diffusion model (document [1]) and the like. Further, the covariance matrix $Q_t$ is sometimes included in the meteorological situation data, but can be given in advance as a parameter. In such a case, the matrix can be made a diagonal matrix $Q_{t=0q}^{2}*I$ using a parameter "$\sigma_q$". Here, "I" represents a unit matrix. A temporal change of "X" can be modeled by the state transition equation D1.

Further, the equation D2 is an observation equation with respect to the state variable "X". In the equation D2, "$Y_t$"

represents the power generation inhibitor total amount vector of the time "t" described above. Further, "H(W$_t$)" is a matrix which is determined by the three-dimensional space solar radiation weight W$_t$ described above, and each row of "H" is configured by W$_t$(S) corresponding to the site "s". Further, a covariance matrix "R$_t$" is a parameter for determining a normal random number expressing an observation noise, and can be made a diagonal matrix R$_t$=σ$_r^2$*I using a parameter "σ$_r$", for example.

The state estimation of the system using the state transition equation and the observation equation by the linear matrix and the normal random umber like this can be performed by filtering algorism called a Kalman filter, for example (document [2]: G., Evensen, Data Assimilation: The Ensemble Kalman Filter, Springer-Verlag, ISBN-3642037100, 2009.).

It should be noted that filtering algorithm is the algorithm which estimates the state "Xt" at the time "t" by using observations "Y0" to "Yt" until the times "t0" to "t" (more specifically, estimates the state at the present time by using observation which is obtained up to the present time).

The target problem of the present embodiment needs to use much information of state transition since there is a little information of observation. Thus, the feature is use of smoothing algorithm that estimates the state "Xt" at the time "t" by using observations "Y0" to "YT" until the times "t0" to "tT". Here, "T" is the final time of the estimation period. t☐T is satisfied. More specifically, the state at the present time is estimated by using the observation after the present time in the estimation period. As the smoothing algorithm, Kalman smoother, ensemble Kalman smoother and the like are proposed (document [2]), and these methods can be used.

Figure 10:
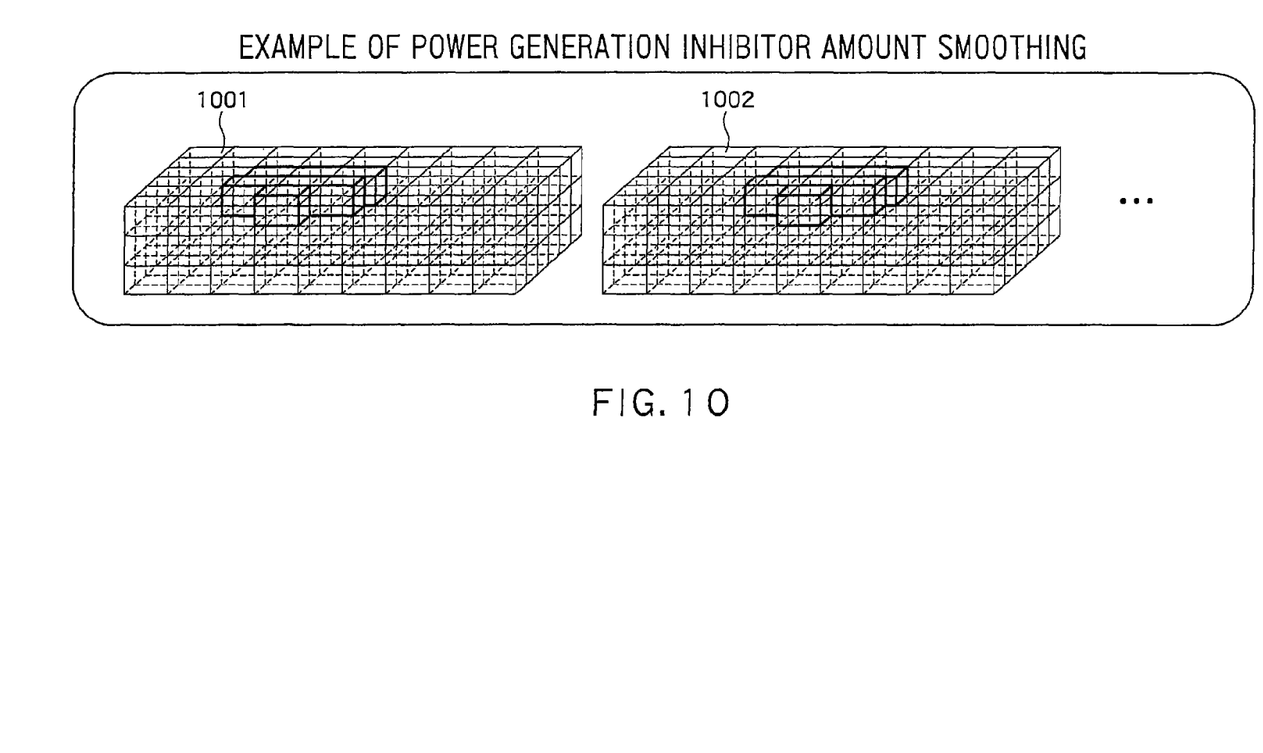
FIG. 10 is a view showing a power generation inhibitor amount smoothing result.

FIG. 10 three-dimensionally shows an example of the power generation inhibitor amount smoothing result which is expressed by the state variable {X0 to XT}. Reference numeral 1001 represents a value of "X" at a certain time, and it is found that an inhibiter which looks like a cloud is present on the highest layer of "Z" of three stages. Further, at a different time, an inhibitor represented by reference numeral 1002 is present, and it can be estimated that the inhibitor of reference numeral 1001 has moved. Such an estimation result is estimated for each time from the estimation start time point "T$_0$" to the prediction start time point "T$_1$" by smoothing algorism. As will be described later, the power generation after "T$_1$" is estimated in the present embodiment. The estimation start time point "T$_0$" is a time when estimation of movement of the power generation inhibitor is started, and estimation of the power generation inhibitor movement is performed from the time point "T$_0$" which is a fixed time before the prediction start time point "T$_1$".

The meteorological situation data correcting unit 108 corrects the meteorological situation data by using the power generation inhibitor amount estimated by the power generation inhibitor amount smoothing unit 107.

Figure 11:
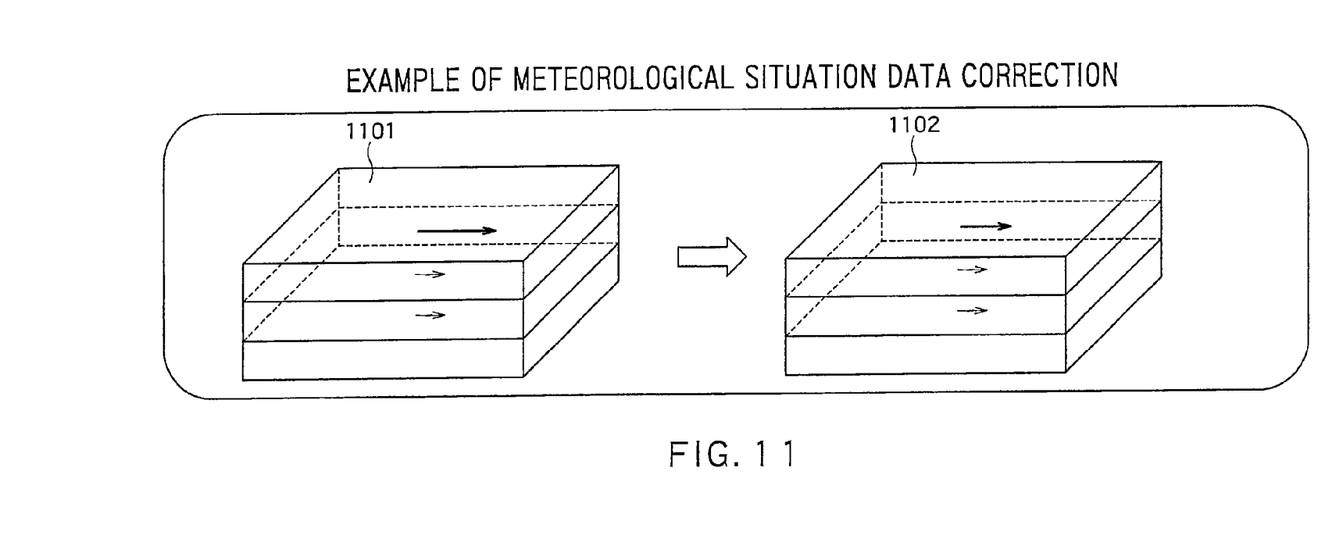
FIG. 11 is a view showing an example of meteorological situation data correction.

FIG. 11 shows an example of meteorological situation data correction.

In FIG. 11, reference numeral 1101 represents the wind direction vector "V" before correction, and smoothing of the power generation inhibitor is performed based on the wind direction vector. In 1101, three kinds of wind direction vectors are adopted in accordance with the height of a three-dimensional cell 901 (see FIG. 9), and the case of taking a constant value irrespective of a time, the x-axis and y-axis is shown. Further, reference numeral 1102 represents a wind direction vector "V'" after correction.

Correction of the wind direction vector can be performed by calculating the temporal change of the clouds of 1001 and 1002, for example. If the change amount of the values of "X" of 1001 and 1002 is calculated, the edge portion of the cloud can be extracted, and therefore, the temporal change of the cloud can be calculated by detecting the change amount of the edge. Then, with the temporal change of the cloud as a correct answer, the wind direction vector can be corrected. For edge extraction processing on the cell, and detection of movement of an object, the library which is used in image recognizing software (for example, GIMP: http://www.gimp.org/) and the like can be used. Correction of the meteorological situation data is not essential, and the following processing also can be continued without performing the present correction.

The power generation predicting unit 109 predicts the power generation inhibitor amount at the prediction target time by using the state transition equation of the power generation inhibitor amount, calculates the power generation inhibitor total amount existing on the straight line from the solar position to the photovoltaic power generation system at the prediction target time, and predicts the power generation amount, by using the estimated power generation inhibitor amount "X(T1)", the meteorological situation data "Z(T1)", the fine weather power generation amount, and the PV facility data.

The prediction target time is each time {t: T$_1$<t≤T$_2$} from the present time (prediction start time point) "T1" to the prediction end time point "T2", and in the power generation prediction, the value of the power generation inhibitor amount "X$_t$" is estimated with respect to each of these times. This can be estimated, by causing the state "X$_{T1}$" at the present time to transition by the state transition matrix "F(Z)" in accordance with the equation D1, and adding the normal random number. For example, estimation can be performed by an equation of E1.

$$X_{T1+k}=F(Z_{T1+k})*F(Z_{T1+k})* \ldots *F(Z_{T1})X_{T1}+\Sigma_k N(0, Q_{T1+k}) \quad \text{E1)}$$

Here, "Z$_{T1+k}$" expresses a meteorological situation in a time "T1+ΔT*k", and can be calculated by using the meteorological prediction data which is obtained from the meteorological situation data providing server. Alternatively, the corrected meteorological situation data "Z$_{T1}$" may be regarded as being kept. By the processing of the equation E1, the power generation inhibitor amount in the time "t" can be estimated.

Next, the position of the sun seen from each site in each time "t" is calculated, and the 3D space solar radiation weight "W$_t$(s)" is calculated with respect to each time. Then, the power generation inhibitor total amount Y$_t$(s) of each site in each time can be calculated by $$Y_t(s)=W_t(s)*X_t. \quad \text{F1)}$$

Then, the result, which is obtained by subtracting this value from the value obtained by converting the fine weather power generation amount estimation value at the time "t" into a solar radiation value, is converted into a power generation amount by using the PV facility data, and thereby, the power generation amount of the site "s" in the prediction time "t" can be predicted. This means the same as predicting the power generation amount by subtracting the value, which is obtained by multiplying the power generation inhibitor total amount by a constant coefficient, from the fine weather power generation amount (maximum power generation amount). The estimation power generation amounts are added up in all the sites, and thereby, power generation amount prediction can be performed. Further, the equation of E1) uses a random number, and therefore, by performing prediction with respect to the samples of a plurality of times, zone prediction can be performed instead of point prediction of the power generation amount.

Figure 12:
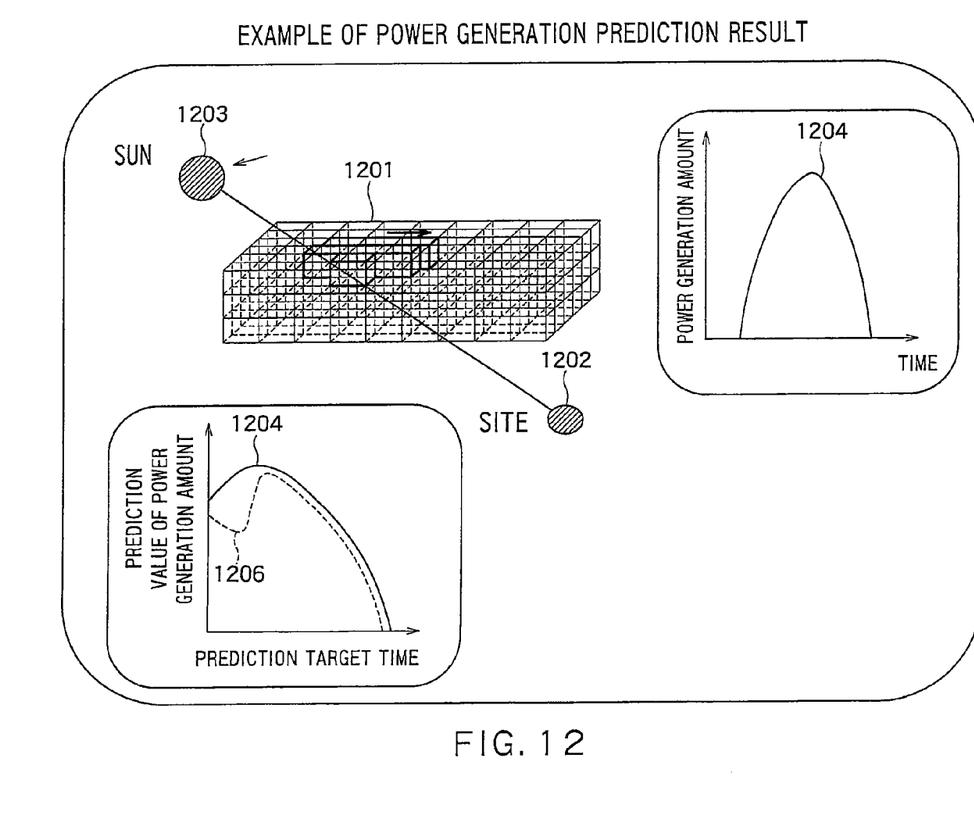
FIG. 12 is a view showing an example of power generation prediction.

FIG. 12 shows an example of power generation prediction.

A distribution 1201 of the power generation inhibitor amount "X" in a certain time is shown. Seen from a site 1202, the sun is at a position 1203 at the time "t", and power generation of some degree is inhibited by clouds at the present time point. If there is no cloud, the site 1202 can generate power in accordance with a curve 1204. The cloud 1201 advances to the right side of the drawing, whereas the sun advances to the left side, and therefore, it is found out that if a certain time passes from the present time point, inhibition to power generation does not occur. The prediction result which is obtained under the situation like this is a dotted line portion 1206. By combination of movement of clouds, aerosol and the like, movement of the sun, the power generation estimation value in the case without an: inhibitor to the power generation and the like, accurate power generation prediction can be performed.

Figure 2:
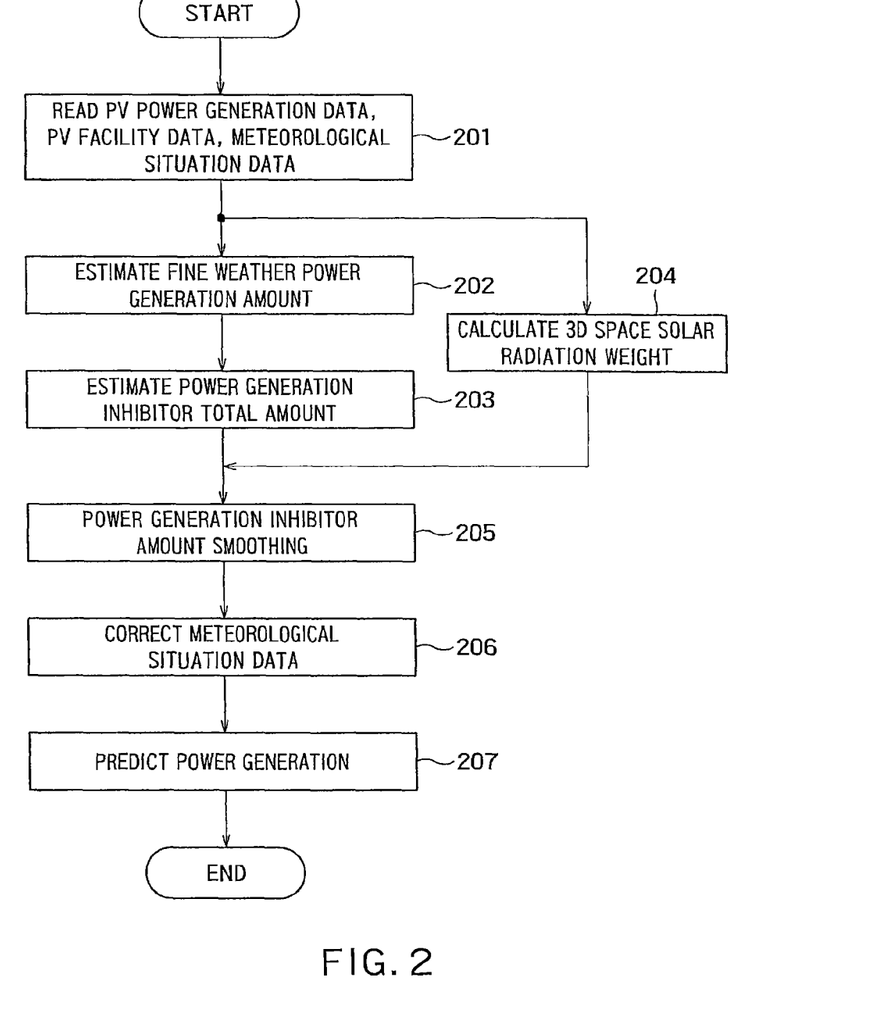
FIG. 2 is an operation flowchart according to the embodiment.

FIG. 2 is a flowchart according to the embodiment.

In FIG. 2, in step 201, the PV power generation data, the PV facility data, and the meteorological situation data $Z_t$ are read.

In step 202, the fine weather power generation amount (maximum power generation amount) which can be generated by the photovoltaic power generation system at the time of fine weather is estimated.

In step 203, the power generation inhibitor total amount "$Y_t$" which is the total of the power generation inhibitor substances which are present until the solar light reaches the photovoltaic power generation system is estimated.

Further, in step 204, the 3D space solar radiation weight $W_t$ is calculated based on the overlap of the straight line connecting the position of the sun and the photovoltaic power generation system, with respect to the three-dimensional cells.

In step 205, the aforementioned smoothing processing is performed, and the power generation inhibitor amount "$X_t$" is estimated.

In step 206, based on the estimated power generation inhibitor amount "$X_t$", correction of the meteorological situation data "$Z_t$" is performed, and the corrected meteorological situation data "$Z'_t$" is calculated. It is possible not to perform correction of the meteorological situation data by omitting step 206.

Finally, in step 207, by the corrected meteorological situation data "$Z'_t$", state transition of the state variable "$X_t$" is performed, and power generation prediction is performed. When correction is not performed in step 206, the meteorological situation data "$Z_t$" can be used instead of the meteorological situation data "$Z'_t$".

In the present embodiment described above, only the wind direction vector "$V_t$" is used as the meteorological situation data, but the atmospheric temperature and the atmospheric pressure on the three-dimensional cells, the steam amount and the like can be used. When such information is used, for example, "$G(Z_t)$" which is a term for modeling the occurrence of a cloud and the like can be introduced as in an equation G1, for example.

$$X_{t+1} = F(Z_t)^* X_t + G(Z_t) + N(0, Q_t) \quad \text{(G1)}$$

As above, according to the present embodiment, highly accurate short-term prediction of the photovoltaic power generation system power generation amount can be realized based on the real power generation actual result data with use of three-dimensional meteorological data, and three-dimensional movement of the solar orbit.

The present embodiment also can be used in a concentrating type photovoltaic power generation system and a solar tracking type photovoltaic power generation system. Further, the present embodiment deals with a photovoltaic power generation system, but also can be used in a solar thermal power generation system and the like since the power generation system using solar heat shows a similar behavior.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power generation predicting apparatus, comprising:
a first storage configured to store photovoltaic (PV) power generation data including actual results of a power generation amount by a PV power generation system in time series;
a second storage configured to store PV facility data representing an installation position and a power generation ability of the PV power generation system;
a third storage configured to store meteorological situation data of three-dimensional cells, wherein the three-dimensional cells form a three-dimensional space above a prediction target area at which the PV power generation system is placed; and
a microprocessor connected to the first to third storages and storing a program which when executed causes the microprocessor to be configured to:
estimate a maximum power generation amount capable of generating by the PV power generation system at each time based on the PV power generation data;
estimate a power generation inhibitor total amount at each time based on the maximum power generation amount wherein the power generation inhibitor total amount is a total of power generation inhibiting substances which are present until a solar light reaches the PV power generation system;
calculate a solar radiation weight for each of the three-dimensional cells at each time based on a straight line passing through the three-dimensional cells the straight line is a line connecting between a solar position and the PV power generation system, and the solar radiation weight expresses an influence degree of each of three-dimensional cells with respect to the power generation inhibitor total amount;
estimate a power generation inhibitor amount in each of the three-dimensional cells at a prediction target time based on the power generation inhibitor total amount, the solar radiation weight, and the meteorological situation data; and
calculate a power generation inhibitor total amount at the prediction target time based on the power generation inhibitor amount and the solar radiation weight of each of the three-dimensional cells at the prediction target time, and predict a power generation amount at the prediction target time based on the power generation inhibitor total amount at the prediction target time, and the maximum power generation amount corresponding to the prediction target time.

2. The apparatus according to claim 1, wherein
the microprocessor is configured to produce a state transition equation and an observation equation each having a state variable, the state variable representing the power generation inhibitor amount of each of the three-dimensional cells, the state transition equation is an equation by which a state variable at a next time is calculated based on a state variable of the time and a state transition matrix determined by meteorological situation data in the time, the observation equation is an equation by which a power generation inhibitor total amount in the time is calculated based on the state variable at the time and a matrix determined by the solar radiation weight at the time, the power generation inhibitor amount in the prediction target time is estimated by the state transition equation, and the microprocessor is configured to calculate the power generation inhibitor total amount at the prediction target time by the observation equation.

3. The apparatus according to claim 2, wherein the microprocessor is further configured to:

correct the meteorological situation data at each time by using the power generation inhibitor amount estimated by the second estimating unit, calculate the state variable by using corrected meteorological situation data based on the state transition equation.

4. The apparatus according to claim 2, wherein the meteorological situation data includes a wind velocity vector for each of the three-dimensional cells, and the microprocessor is configured to produce the state transition equation by using a linear state transition matrix obtained based on the wind velocity vector, produces the observation equation by using a linear state observation matrix obtained based on the solar radiation weight, and performs state smoothing by Kalman smoother.

5. The apparatus according to claim 3, wherein the meteorological situation data include a wind direction vector for each of the three-dimensional cells, and the microprocessor is configured to calculate an edge based on a spatial differential value of the power generation inhibitor amount, and corrects the wind direction vector based on a change amount of the edge.

6. The apparatus according to claim 1, wherein the microprocessor is configured to determine a solar radiation weight for each of the three-dimensional cells in accordance with a length of a line segment which passes insides of each of the three-dimensional cells.

7. The apparatus according to claim 1, wherein the microprocessor is configured to predict the power generation amount by subtracting a value from the maximum power generation amount, the value being obtained by multiplying the power generation inhibitor total amount by a constant coefficient.

8. A power generation predicting method, comprising:

storing in a storage actual results of a power generation amount by a photovoltaic (PV) power generation system in time series, PV facility data representing an installation position and a power generation ability of the PV power generation system, and meteorological situation data of three-dimensional cells forming a three-dimensional space above a prediction target area at which the PV power generation system is placed;

executing a program in a microprocessor causing the microprocessor to be configured to:

estimate a maximum power generation amount to be able to which can be generated by the PV power generation system at a unit of time based on PV power generation data including actual results of a power generation amount by the PV power generation system in time series;

estimate a power generation inhibitor total amount at each time based on the PV power generation data, the PV facility data and the maximum power generation amount wherein the power generation inhibitor total amount is a total of power generation inhibiting substances which are present until a solar light reaches the PV power generation system;

calculate a solar radiation weight for each of the three-dimensional cells at each time based on a straight line passing through the three-dimensional cells, the straight line is a line connecting between a solar position and the PV power generation system, and the solar radiation weight expresses an influence degree of each of three-dimensional cells with respect to the power generation inhibitor total amount;

estimate a power generation inhibitor amount included in each of the three-dimensional cells at a prediction target time based on the power generation inhibitor total amount, the solar radiation weight, and the meteorological situation data of the three-dimensional cells; and calculate a power generation inhibitor total amount at the prediction target time based on the power generation inhibitor amount and the solar radiation weight of each of the three-dimensional cells at the prediction target time, and predicting a power generation amount at the prediction target time based on the power generation inhibitor total amount at the prediction target time, and the maximum power generation amount corresponding to the prediction target time.

* * * * *